(12) United States Patent
Lasser (10) Patent No.: US 8,019,928 B2
(45) Date of Patent: Sep. 13, 2011

(54) METHOD OF MANAGING A MULTI-BIT-CELL FLASH MEMORY

(75) Inventor: Menahem Lasser, Kohav Yair (IL)

(73) Assignee: SanDisk IL Ltd., Kfar Saba (IL)

( * ) Notice: Subject to any disclaimer, the term of this patent is extended or adjusted under 35 U.S.C. 154(b) by 624 days.

(21) Appl. No.: 10/829,979

(22) Filed: Apr. 23, 2004

(65) Prior Publication Data
US 2005/0180209 A1    Aug. 18, 2005

Related U.S. Application Data (60) Provisional application No. 60/544,442, filed on Feb. 15, 2004.

(51) Int. Cl.
*G06F 12/00* (2006.01)
*G06F 12/02* (2006.01)

(52) U.S. Cl. ........................ 711/103; 711/156
(58) Field of Classification Search .................. 711/103, 711/156
See application file for complete search history.

(56) References Cited

U.S. PATENT DOCUMENTS

| | | | |
|---|---|---|---|
| 5,404,485 A | 4/1995 | Ban | |
| 5,434,825 A | 7/1995 | Harari | |
| 5,544,312 A * | 8/1996 | Hasbun et al. | 714/42 |
| 5,671,388 A * | 9/1997 | Hasbun | 711/103 |
| 5,859,795 A * | 1/1999 | Rolandi | 365/168 |
| 5,930,167 A | 7/1999 | Lee et al. | |
| 5,936,884 A * | 8/1999 | Hasbun et al. | 365/185.03 |
| 5,937,425 A | 8/1999 | Ban | |
| 6,104,641 A * | 8/2000 | Itou | 365/189.01 |
| 6,148,354 A | 11/2000 | Ban et al. | |
| 6,297,988 B1 | 10/2001 | Parker et al. | |
| 6,426,893 B1 | 7/2002 | Conley et al. | |
| 6,522,580 B2 | 2/2003 | Chen et al. | |
| 6,549,457 B1 * | 4/2003 | Srinivasan et al. | 365/185.03 |
| 6,687,325 B1 | 2/2004 | Wells | |

(Continued)

FOREIGN PATENT DOCUMENTS

KR    10-2000-0031100    5/2000

OTHER PUBLICATIONS

M. Bauer et al. A Multilevel-Cell 32Mb Flash Memory. 1995 IEEE International Solid-State Circuits Conference. pp. 132-134.*

(Continued)

*Primary Examiner* — Sanjiv Shah
*Assistant Examiner* — Samuel Dillon
(74) *Attorney, Agent, or Firm* — Toler Law Group (57) ABSTRACT

A flash memory that supports N>1-bit programming is managed by, for at least one block of the memory, selecting the value of N to use for the block, designating one or more cells of the block as flag cells, and programming the flag cells to represent the selected value of N. Preferably, N is encoded according to whether the threshold voltages of the flag cells are greater or less than a reference voltage common to all values of N. The other cells of the block then are programmed in accordance with the selected value of N. N and its flag cells are selected when the block is first used to store data. Subsequent to an erasure of the block, a different value of N may be selected.

38 Claims, 3 Drawing Sheets

U.S. PATENT DOCUMENTS

| | | | |
|---|---|---|---|
| 6,834,331 B1 * | 12/2004 | Liu | 711/156 |
| 6,839,823 B1 * | 1/2005 | See et al. | 711/171 |
| 6,988,175 B2 | 1/2006 | Lasser | |
| 7,181,672 B2 * | 2/2007 | Atri et al. | 714/763 |
| 7,310,347 B2 | 12/2007 | Lasser | |
| 7,525,840 B2 * | 4/2009 | Rahman et al. | 365/185.03 |
| 2001/0038553 A1 * | 11/2001 | Parker et al. | 365/185.03 |

OTHER PUBLICATIONS

Tanenbaum, A.S. Structured Computer Organization. 1984. Prentice-Hall Inc.*

U.S. Appl. No. 10/735,667, filed Dec. 2003, Lasser et al.

B. Eitan et al. "Multilevel Flash Cells and Their Trade-Offs," 1996 IEEE, 4 pages.

Notification of Transmittal of the International Search Report or the Declaration and International Search Report and Written Opinion received in International Application No. PCT/IL05/00032 from the International Searching Authority mailed Dec. 4, 2006, 10 pages.

Korean Office Action and Translation mailed Feb. 26, 2010 in Korean Patent Application No. 10-2009-7026223, 7 pages.

International Preliminary Report on Patentability received in International Application No. PCT/IL2005/001149 mailed Mar. 24, 2009, including the International Search Report and Written Opinion from the International Searching Authority mailed Jul. 18, 2008, 9 pages.

Korean Office Action Translation for Korean Patent Application No. 10-2006-7017506 mailed Apr. 29, 2009, 6 pages.

Korean Office Action Translation for Korean Patent Application No. 10-2006-7017506 mailed Oct. 30, 2009, 4 pages.

Korean Office Action Translation for Korean Patent Application No. 10-2007-7010170 mailed Apr. 27, 2009, 11 pages.

Non-Final Office Action for U.S. Appl. No. 11/198,180 mailed Oct. 18, 2006, 21 pages.

Final Office Action for U.S. Appl. No. 11/198,180 mailed Apr. 6, 2007, 17 pages.

Advisory Action Before the Filing of an Appeal Brief for U.S. Appl. No. 11/198,180 mailed Jun. 13, 2007, 3 pages.

Non-Final Office Action for U.S. Appl. No. 11/198,180 mailed Apr. 17, 2008, 16 pages.

Final Office Action for U.S. Appl. No. 11/198,180 mailed Jan. 26, 2009, 20 pages.

Notice of Allowance and Fee(s) Due for U.S. Appl. No. 11/198,180 mailed Jul. 9, 2009, 7 pages.

Notice of Allowance and Fee(s) Due for U.S. Appl. No. 11/198,180 mailed Jan. 11, 2010, 4 pages.

Non-Final Office Action for U.S. Appl. No. 11/923,688 mailed Jun. 25, 2008, 19 pages.

Final Office Action for U.S. Appl. No. 11/923,688 mailed Dec. 12, 2008, 20 pages.

Non-Final Office Action for U.S. Appl. No. 11/923,688 mailed Feb. 1, 2010, 19 pages.

Non-Final Office Action for U.S. Appl. No. 11/923,688 mailed Aug. 2, 2010, 20 pages.

Final Office Action mailed Feb. 1, 2011 in U.S. Appl. No. 11/923,688, 21 pages.

* cited by examiner

METHOD OF MANAGING A MULTI-BIT-CELL FLASH MEMORY

This is a continuation-in-part of U.S. Provisional Patent Application No. 60/544,442, filed Feb. 15, 2004

FIELD AND BACKGROUND OF THE INVENTION

The present invention relates to flash memories and, more particularly, to a method of managing a flash memory, whose cells can be programmed with either one bit each or more than one bit each, so that the number of bits per cell can be determined upon power-up or during recovery from power loss.

Flash memory devices have been known for many years. Typically, each cell within a flash memory stores one bit of information. Traditionally, the way to store a bit has been by supporting two states of the cell—one state represents a logical "0" and the other state represents a logical "1". In a flash memory cell the two states are implemented by having a floating gate above the cell's channel (the area connecting the source and drain elements of the cell's transistor), and having two valid states for the amount of charge stored within this floating gate. Typically, one state is with zero charge in the floating gate and is the initial unwritten state of the cell after being erased (commonly defined to represent the "1" state) and another state is with some amount of negative charge in the floating gate (commonly defined to represent the "0" state). Having negative charge in the gate causes the threshold voltage of the cell's transistor (ie. the voltage that has to be applied to the transistor's control gate in order to cause the transistor to conduct) to increase. Now it is possible to read the stored bit by checking the threshold voltage of the cell—if the threshold voltage is in the higher state then the bit value is "0" and if the threshold voltage is in the lower state then the bit value is "1". Actually there is no need to accurately read the cell's threshold voltage—all that is needed is to correctly identify in which of the two states the cell is currently located. For that purpose it is enough to make a comparison against a reference voltage value that is in the middle between the two states, and thus to determine if the cell's threshold voltage is below or above this reference value.

Figures 1A, 1B:
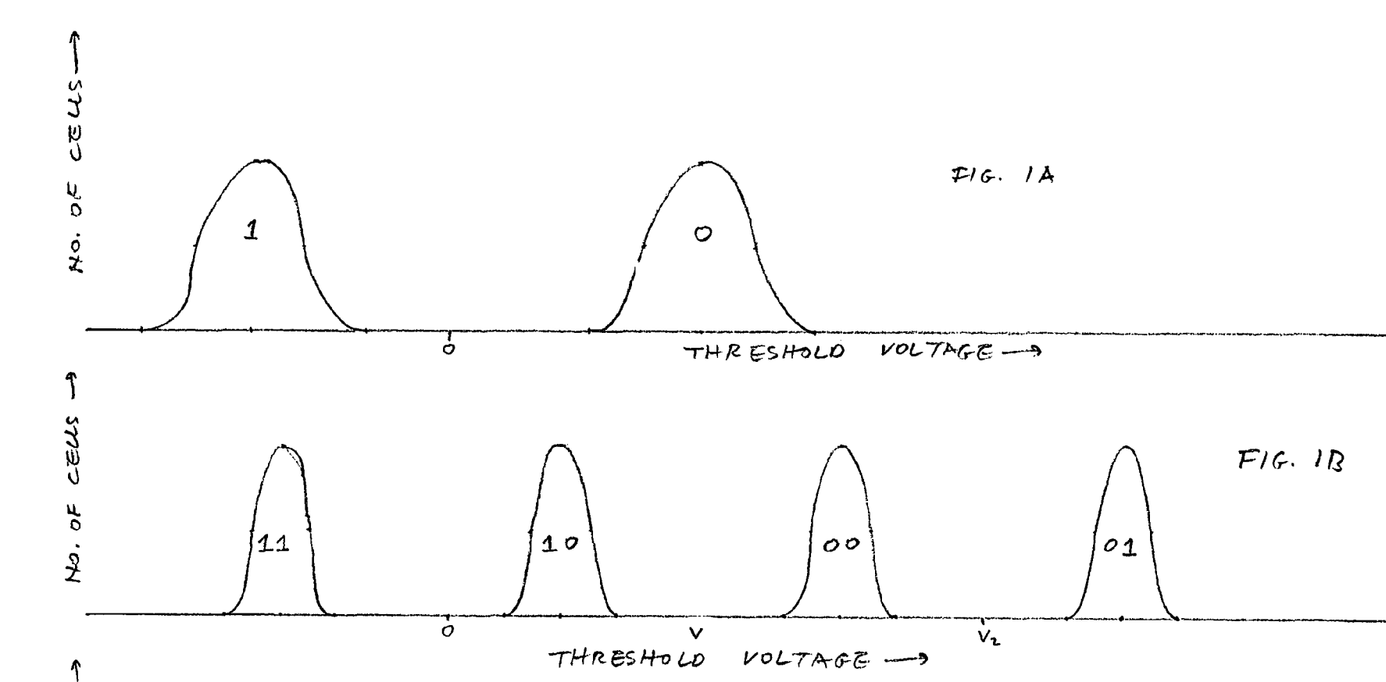
FIGS. 1A and 1C illustrate the threshold voltage distributions of flash cells programmed in 1-bit mode.
FIG. 1B illustrates the threshold voltage distributions of flash cells programmed in 2-bit mode.

FIG. 1A shows graphically how this works. Specifically, FIG. 1A shows the distribution of the threshold voltages of a large population of cells. Because the cells in a flash device are not exactly identical in their characteristics and behavior (due, for example, to small variations in impurities concentrations or to defects in the silicon structure), applying the same programming operation to all the cells does not cause all of the cells to have exactly the same threshold voltage. (Note that, for historical reasons, writing data to a flash memory is commonly referred to as "programming" the flash memory.) Instead, the threshold voltage is distributed similar to the way shown in FIG. 1A. Cells storing a value of "1" typically have a negative threshold voltage, such that most of the cells have a threshold voltage close to the value shown by the left peak of FIG. 1A, with some smaller numbers of cells having lower or higher threshold voltages. Similarly, cells storing a value of "0" typically have a positive threshold voltage, such that most of the cells have a threshold voltage close to the value shown by the right peak of FIG. 1A, with some smaller numbers of cells having lower or higher threshold voltages.

In recent years a new kind of flash device has appeared on the market, using a technique conventionally called "Multi Level Cells" or MLC for short. (This nomenclature is misleading, because the previous type of flash cells also have more than one level: they have two levels, as described above. Therefore, the two kinds of flash cells are referred to herein as "Single Bit Cells" (SBC) and "Multi-Bit Cells" (MBC).) The improvement brought by the MBC flash is the storing of two bits in each cell. (In principle MBC also includes the storage of more than two bits per cell, but such cells are not in the market yet at the present time In order to simplify the explanations, the two-bit case is emphasized herein. It should however be understood the present invention is equally applicable to flash memory devices that support more than two bits per cell). In order for a single cell to store two bits of information the cell must be able to be in one of four different states. As the cell's "state" is represented by its threshold voltage, it is clear an MBC cell should support four different valid ranges for its threshold voltage. FIG. 1B shows the threshold voltage distribution for a typical MBC cell. As expected, FIG. 1B has four peaks, each corresponding to one state. As for the SBC case, each state is actually a range and not a single number. When reading the cell's contents, all that must be guaranteed is that the range that the cell's threshold voltage is in is correctly identified. For a prior art example of an MBC flash device see U.S. Pat. No. 5,434,825 to Harari.

When encoding two bits in an MBC cell by the four states, it is common to have the left-most state in FIG. 1B (typically having a negative threshold voltage) represent the case of both bits having a value of "1". (In the discussion below the following notation is used—the two bits of a cell are called the "lower bit" and the "upper bit". An explicit value of the bits is written in the form ["upper bit" "lower bit"], with the lower bit value on the right. So the case of the lower bit being "0" and the upper bit being "1" is written as "10". One must understand that the selection of this terminology and notation is arbitrary, and other names and encodings are possible). Using this notation, the left-most state represents the case of "11". The other three states are typically assigned by the following order from left to right—"10", "00", "01". One can see an example of an implementation of an MBC NAND flash device using such encoding as described above in U.S. Pat. No. 6,522,580 to Chen, which patent is incorporated by reference for all purposes as if fully set forth herein. See in particular FIG. 8 of the Chen patent. It should be noted though that the present invention does not depend on this assignment of the states, and any other ordering can be used, provided that the ordering satisfies the condition stated below. When reading an MBC cell's content, the range that the cell's threshold voltage is in must be identified correctly; only in this case this cannot always be achieved by comparing to one reference voltage, and several comparisons may be necessary. For example, in the case illustrated in FIG. 1B, one way to read the lower bit is first to compare the cell's threshold voltage to a reference comparison voltage $V_1$ and then, depending on the outcome of the comparison, to compare the cell's threshold voltage to either a zero reference comparison voltage or a reference comparison voltage $V_2$. Another way to read the lower bit is to compare the cell's threshold voltage unconditionally to both the zero reference voltage and $V_2$. In either case, two comparisons are needed.

MBC devices provide a great advantage of cost—using a similarly sized cell one stores two bits rather than one. However, there are also some drawbacks to using MBC flash—the average read and write times of MBC memories are longer than of SLC memories, resulting in lower performance. Also, the reliability of MBC is lower than SBC. This can easily be understood—the differences between the threshold voltage ranges in MBC are much smaller than in SBC. Thus, a disturbance in the threshold voltage (e.g. leaking of the stored charge causing a threshold voltage drift, interference from operations on neighboring cells, etc.) that may have gone unnoticed in SBC because of the large gap between the two states, might cause an MBC cell to move from one state to another, resulting in an erroneous bit. The end result is a lower quality specification of MBC cells in terms of data retention time or the endurance of the device to many write/erase cycles. Thus there are advantages to using both MBC cells and SBC cells, and the selection can be different depending on the application's requirements.

It is obvious that a cell designed for MBC operation should also be able to operate as an SBC cell. After all, two states are just a subset of 4 states. Indeed, this idea already has appeared in the prior art—see for example U.S. Pat. No. 6,426,893 to Conley et al., where it is proposed to use both MBC and SBC modes within the same device, selecting certain parts of the device to operate with highest density in MBC mode, while other parts are used in SBC mode and provide better performance.

Other prior art goes even further—deciding on the mode a specific flash block operates in (whether MBC or SBC) dynamically during the application's run-time. For example, U.S. Pat. No. 5,930,167 to Lee et al. describes a system in which incoming data that has to be stored is first programmed in SBC mode so as to provide fast response time, and later is reprogrammed using MBC mode. The SBC mode thus provides a kind of caching mechanism. The second writing (done in MBC mode) can be done in the same place where the data was originally programmed in SBC mode, so it is clear the same area is dynamically switched between modes. Such programming in SBC mode vs. MBC mode is referred to herein as "N-bit programming", with N=1 referring to SBC mode and N>1 referring to MBC mode.

However, such dynamic mode switching of flash blocks during run-time creates a problem. Think about what happens when power is unexpectedly removed from the device. When the power is later restored and the system's software starts running again, the system has to find out what mode was previously used for writing the data. Without knowing this, a wrong reading might result. FIGS. 1A and 1B illustrate why—suppose a cell was really programmed using 1-bit mode to contain a "0", and the distribution is according to FIG. 1A. If the system mistakenly assumes the cell was programmed using 2-bit mode, the system will instruct the device to attempt a reading using 2-bit mode, which will cause the device circuitry to try to identify which of the four states exists. However, trying to distinguish between the two center states ("10" and "00" in our example) the flash circuitry might place the reference comparison voltage at a voltage value that is within the distribution range of the rightmost state of the SBC cell. FIG. 1B shows such a case: reference comparison voltage $V_1$ is exactly in the middle of the upper threshold voltage distribution of FIG. 1A. This means the result of this comparison and consequently the result of this reading cannot be predicted—in some cells the reading will return "10" and in others it will return "00", even though all such cells were programmed to "0" in 1-bit mode. Such reading under the wrong mode produces unpredictable results. If such mistakes are allowed to take place, the contents of the storage device will become useless.

Figure 1C:
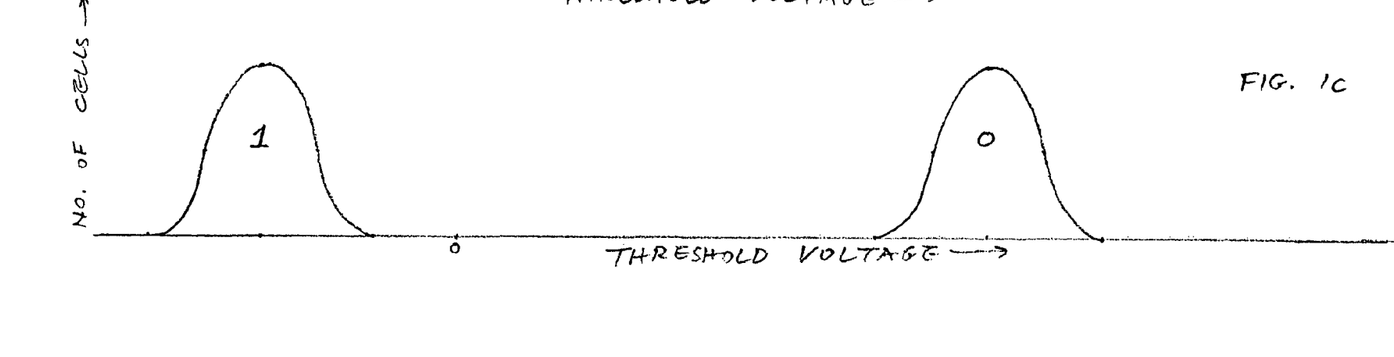

Similarly, if the distribution of threshold voltages in a 1-bit mode cell is as shown in FIG. 1C, if the system mistakenly assumes that the cell was programmed using 2-bit mode, when trying to distinguish between the two rightmost states ("00" and "01" in our example) the flash circuitry places reference comparison voltage $V_2$ at a voltage value within the distribution of the right-most state of the SBC cell. Sometimes the presumed lower bit of the cell is read as "0", and sometimes the presumed lower bit of the cell is read as "1".

Obviously, one can defend against such mistakes by keeping in the storage device detailed tables in which it is specified which mode is used for writing each memory block. The table itself must be kept in a fixed predetermined mode and in a pre-known location, so that there are no mistakes in reading the table. But such a solution has very undesirable consequences. First, each "useful" write operation must now be accompanied by an "auxiliary" write for updating the table, resulting in lower write performance. Second, the complexity of the flash management software is significantly increased—protection must be provided against loss of the table due to a block becoming bad; protection must be provided against a power loss occurring in the middle of updating the table, etc.

There is thus a widely recognized need for, and it would be highly advantageous to have, an efficient way to tell which mode, SBC or MBC, was used to program a flash memory block that could have been programmed using either mode.

SUMMARY OF THE INVENTION

According to the present invention there is provided a method of managing a flash memory that includes at least one block, each block including a plurality of cells, each cell having a respective threshold voltage, the method including the steps of: for one of the at least one block: (a) selecting a respective first value of a parameter N of an N-bit programming mode for the one block; (b) designating at least one cell of the one block as a flag cell; and (c) setting the at least one flag cell of the one block to represent the respective first value of N.

According to the present invention there is provided a memory device including: (a) a flash memory including at least one block, each at least one block including a plurality of cells; and (b) a flash memory controller operative, for one of the at least one block: (i) to select a respective value of a parameter N of an N-bit programming mode, (ii) to designate at least one cell of the one block as a flag cell, and (iii) to set the at least one flag cell of the one block to represent the respective value of N.

According to the present invention there is provided a system including: (a) a flash memory including at least one block, each at least one block including a plurality of cells; (b) a non-volatile memory for storing program code for, for one of the at least one block: (i) selecting a respective value of a parameter N of an N-bit programming mode, (ii) designating at least one cell of the one block as a flag cell, and (iii) setting the at least one flag cell of the one block to represent the respective value of N; and (c) a processor for executing the program code.

According to the present invention there is provided a computer-readable storage medium having computer-readable code embedded on the computer-readable storage medium, the computer readable code for managing a flash memory that includes at least one block, each block including a plurality of cells, the computer-readable code including program code for, for one of the at least one block: (a) selecting a respective value of a parameter N of an N-bit programming mode; (b) designating at least one cell of the block as a flag cell; and (c) setting the at least one flag cell of the block to represent the respective value of N.

According to the present invention there is provided a method of managing a non-volatile array of storage elements individually having a storage window divisible into a plurality of defined ranges of storage levels representative of $N \geq 1$ bits of data and which are separated from one another, the method including the steps of: (a) selecting a first value of N;

(b) designating a storage element as a flag storage element; and (c) setting the flag storage element to represent the first value of N.

According to the present invention there is provided a memory device including: (a) a non-volatile array of storage elements individually having a storage window divisible into a plurality of defined ranges of storage levels representative of $N \geq 1$ bits of data and which are separated from one another; and (b) a controller for: (i) selecting a value of N, (ii) designating one storage element as a flag storage element, and (iii) setting the flag storage element to represent the value of N.

According to the present invention there is provided a system including: (a) a non-volatile array of storage elements individually having a storage window divisible into a plurality of defined ranges of storage levels representative of $N \geq 1$ bits of data and which are separated from one another; (b) a non-volatile memory for storing program code for: (i) selecting a value of N, (ii) designating one storage element as a flag storage element, and (iii) setting the flag storage element to represent the value of N; and (c) a processor for executing the program code.

According to the present invention there is provided a computer-readable storage medium having computer-readable code embedded on the computer-readable storage medium, the computer-readable code for managing a non-volatile array of storage elements individually having a storage window divisible into a plurality of defined ranges of storage levels representative of $N \geq 1$ bits of data and which are separated from one another, the computer-readable code including: (a) program code for selecting a value of N; (b) program code for designating a storage element as a flag storage element; and (c) program code for setting the flag storage element to represent the value of N.

The smallest group of flash cells for which an N-bit programming mode can be jointly selected is referred to herein as a "block" of flash cells. The smallest group of cells within a block of a NAND flash memory which can be programmed together is referred to herein as a "page". The N=2 NAND flash memories presently available commercially are those described in the Chen et al. patent cited above. In these memories, the upper bits and the lower bits of the cells belong to different pages. It also is possible to have each cell of a N=2 NAND flash memory belong to a particular page. The present invention works for both kinds of N=2 NAND flash memories.

According to the present invention, a first value of N is selected separately for each of at least some of the blocks of the flash memory. A set of one or more cells of each block is designated as a set of flag cells. The flag cell(s) of each block is/are set to represent the value of N selected for that block. "Setting" a flag cell means either leaving the flag cell unprogrammed or programming one or more bits of the flag cell, preferably in N-bit programming mode, to represent the value of N selected for the cell's block.

Preferably, at most only one of the bits of each flag cells ever is programmed to represent N. The other bits of the flag cells are not programmed for any purpose whatsoever, but are left unprogrammed.

Preferably, the programming of the flag cells is done using write commands that are publicly available to users of the flash memory. Such write commands are referred to herein as "public" write commands. This is in contrast to write commands that are used by flash memory manufacturers for in-house purposes and that are not made known to the general public. For example, some manufacturers of flash memories include within their memories "secret" and "hidden" blocks that are used during factory testing to store test results; and special sequences of command bytes are used for accessing these "secret" and "hidden" blocks.

Preferably, the value N=1 is represented by leaving the flag cell(s) unprogrammed.

When the flag cell(s) of a block is/are read to determine the block's value of N, the flag cells are read only according to the N=1 mode. Equivalently, if all values of N share a common reference voltage that distinguishes unprogrammed cells from programmed cells, e.g. by the threshold voltage of a programmed cell being greater than the reference voltage and the threshold voltage of an unprogrammed cell being less than the reference voltage, then the flag cell(s) of a block is/are read to determine the block's value of N by comparing the threshold voltage(s) of the flag cell(s) to that reference voltage.

Preferably, one or more other cells of each block also are programmed according to the value of N selected for that block, either substantially simultaneously with the setting of the flag cell(s) of the block or subsequent to the setting of the flag cell(s) of the block.

Preferably, a block's value of N can be changed dynamically. A second value of N is selected for the block and the flag cell(s) of the block is/are set to represent the new value of N. The new value of N may be the same as the old value of N or may be different from the old value of N. Most preferably, the block is erased between the first setting of the flag cell(s) and the second setting of the flag cell(s).

Preferably, the permissible values of N are 1 and 2.

A memory device of the present invention includes a flash memory that includes at least one block, and a flash memory controller that manages the programming mode of the block(s) using the method of the present invention. A system of the present invention includes a flash memory that includes at least one block, a non-volatile memory (usually but not necessarily different from the flash memory) that stores program code for implementing the method of the present invention, and a processor for executing the code. Preferably, the flash memory is a NAND flash memory, although the principles of the present invention extend to all flash memories, including, for example, NOR flash memories.

The scope of the present invention also includes a computer-readable storage medium in which is embedded computer-readable code for implementing the method of the present invention.

More generally, the scope of the present invention extends beyond flash memories to include any of the memories discussed in the Chen patent cited above: memories that include non-volatile arrays of storage elements such that each storage element has a storage window divisible into a plurality of defined ranges of storage levels that represent one or more bits of data. The cells of a MBC flash memory are examples of such storage elements. The blocks of a MBC flash memory are examples of such non-volatile arrays.

BRIEF DESCRIPTION OF THE DRAWINGS

The invention is herein described, by way of example only, with reference to the accompanying drawings, wherein.

DESCRIPTION OF THE PREFERRED EMBODIMENTS

The present invention is of a method of managing the programming of the cells of a flash memory with different numbers of bits. Specifically, the present invention can be used, during normal power-up or upon recovery from a power loss, to determine the bit number mode that was used to program the flash cells of each block of the memory.

The principles and operation of a flash memory according to the present invention may be better understood with reference to the drawings and the accompanying description.

The preferred embodiment of the present invention assumes that the reference voltage used to distinguish the unprogrammed state of a cell from any of its programmed states is the same for all values of N. This condition is in fact satisfied by most flash memories that support N>1, because commonly the states of a N=1 flash cell are defined so that the "1" state has a negative threshold voltage and the "0" state has a positive threshold voltage; and the states of a N>1 flash cell are defined so that the unprogrammed state (e.g. the "11" state of a N=2 flash cell) has a negative threshold voltage and the other states have positive threshold voltages. A reference voltage of zero then serves to distinguish the unprogrammed state of any flash cell from the programmed state(s) of any flash cell, independent of the value of N used to program the cell. This is precisely the situation illustrated in FIGS. 1A and 1B. Note that it is not necessary for the reference voltage that distinguishes the unprogrammed state from the programmed state(s) to be zero volts, as long as the same reference voltage works for all values of N.

Within each block of a flash memory that supports N>1, a set of one or more cells is reserved for use as flag cells to indicate the value of N to be used for reading and programming the cells of the block. Note that N is allowed to change over the lifetime of the block. For example, if the flash memory is managed as taught in the Lee et al. patent cited above, a block that initially is used with N=1 to cache data may subsequently be used with N=2 for long-term storage of data.

Each page of a NAND flash memory includes both a main portion that typically is used to store user data and an additional, smaller portion that typically is reserved for management functions. Most conveniently, the flag cells are selected from among the cells assigned to the management portions of the blocks.

No matter what value of N is assigned to a block, the flag cell(s) is/are programmed as though N=1, in the sense that only one bit per cell is changed from its unprogrammed value. For example, under the convention used above in which the bit value stored in an unprogrammed N=2 cell is interpreted as two "1" bits, a flag cell is either left unprogrammed or programmed as either "10" or "01", but never as "00".

The simplest way of encoding N in flag cells of a block whose cells support N equal to either 1 or 2 uses only one flag cell.

In one preferred embodiment of the present invention, if N=2, the flag cell is left unprogrammed. If N=1, the flag cell is programmed as "0". Using the threshold voltage distributions of FIGS. 1A and 1B, if the threshold voltage of the flag cell is found to be negative, then N is guaranteed to be equal to 2, and if the threshold voltage of the flag cell is found to be positive, then N is guaranteed to be equal to 1. For redundancy, it is preferable to use several flag cells per block; but all the flag cells of the block are set similarly: all the flag cells are left unprogrammed to indicate that N=2 and are programmed as "0" to indicate that N=1. Care must be taken never to program the second bit of the flag cell(s) of a N=2 block, because such programming would change the threshold voltage(s) of the flag cell(s) from negative to positive, thereby changing the meaning of the flag(s) from "N=2" to "N=1".

In another preferred embodiment of the present invention, if N=1, the flag cell is left unprogrammed; and if N=2, the flag cell is programmed as either "10" or "01". Using the threshold voltage distributions of FIGS. 1A and 1B, if the threshold voltage of the flag cell is found to be negative, then N is guaranteed to be equal to 1, and if the threshold voltage of the flag cell is found to be positive, then N is guaranteed to be equal to 2. Again, for redundancy, it is preferable to use several flag cells per block; but all the flag cells of the block are set similarly: all the flag cells are left unprogrammed to indicate that N=1 and are programmed as either "10" or "01" to indicate that N=2. Under this preferred embodiment, it does not matter whether the second bit of the flag cell(s) of a N=2 block are programmed, because the threshold voltage(s) of the flag cell(s) are positive in any case.

Normally, N is encoded in the flag cell(s) of a block the first time data are programmed to the block either the first time the block is used or following an erasure of the block. An exception to this general rule applies to flash memories that support partial page programming. If the flash memory supports partial page programming, then the flag cell(s) of a block optionally are programmed when N is selected, before any data are programmed to the block.

Figure 2:
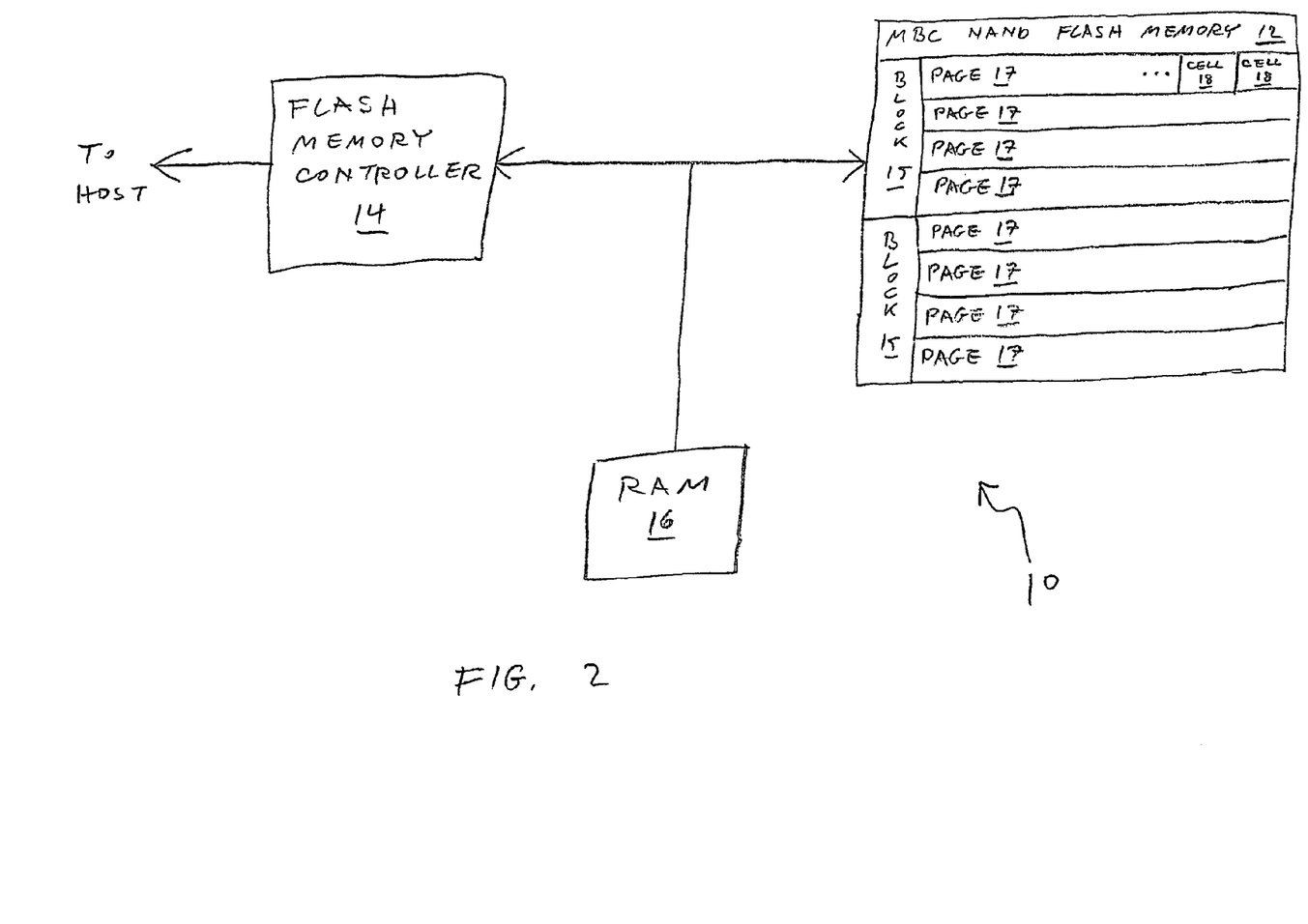
FIG. 2 is a high-level block diagram of a flash memory device of the present invention.

Returning now to the drawings, FIG. 2 is a high-level block diagram of a flash memory device 10 of the present invention. FIG. 2 is adapted from FIG. 1 of U.S. Pat. No. 5,404,485, to Ban, which patent is incorporated by reference for all purposes as if fully set forth herein. Device 10 includes an MBC NAND flash memory 12, a flash memory controller 14 and a RAM 16. Memory 12 includes a plurality of blocks 15, of which two are shown. Each block 15 includes four pages 17. Each page 17 includes a plurality of cells 18, of which two are shown in the first page 17. Controller 14 manages memory 12 as taught in U.S. Pat. No. 5,404,485 and in U.S. Pat. No. 5,937,425, also to Ban, which patent also is incorporated by reference for all purposes as if fully set forth herein. (U.S. Pat. No. 5,404,485 applies to the management of flash memories generally. U.S. Pat. No. 5,937,425 is specific to NAND flash memories.) Controller 14 exchanges data stored in memory 12 with a host device (not shown) in the conventional manner. For example, if device 10 is used for non-volatile data storage in a system such as a personal computer, then controller 14 communicates with the other components of the system via the system's bus. If device 10 is a portable storage device that is reversibly attached to a host using a suitable interface, for example the USB interface taught in U.S. Pat. No. 6,148,354, to Ban et al., then controller 14 communicates with the host via that interface.

In addition, controller 14 decides, for each block of memory 12, whether to store data in that block in SBC mode (N=1) or in MBC mode (N>1). Which mode is appropriate for which kind of data is up to the programmer of controller 14. For example, as discussed above, Lee et al. advocate using SBC for caching of data that later are transferred to long term storage in MBC mode because of the greater programming speed of SBC mode vs. MBC mode. By contrast, Lasser et al., in U.S. Pat. No. 6,903,972, advocate using SBC mode rather than MBC mode for archiving data because of SBC mode's greater reliability. In each block of memory 12, controller 14 reserves one or more flag cells to store the value of N selected for that block and sets that/those flag cell(s) accordingly, as described above. During normal system power-up, or during recovery from a power failure, controller 14 reads each block's flag cell(s), as described above, to determine which value of N has been used to program the cells of that block.

Figure 3:
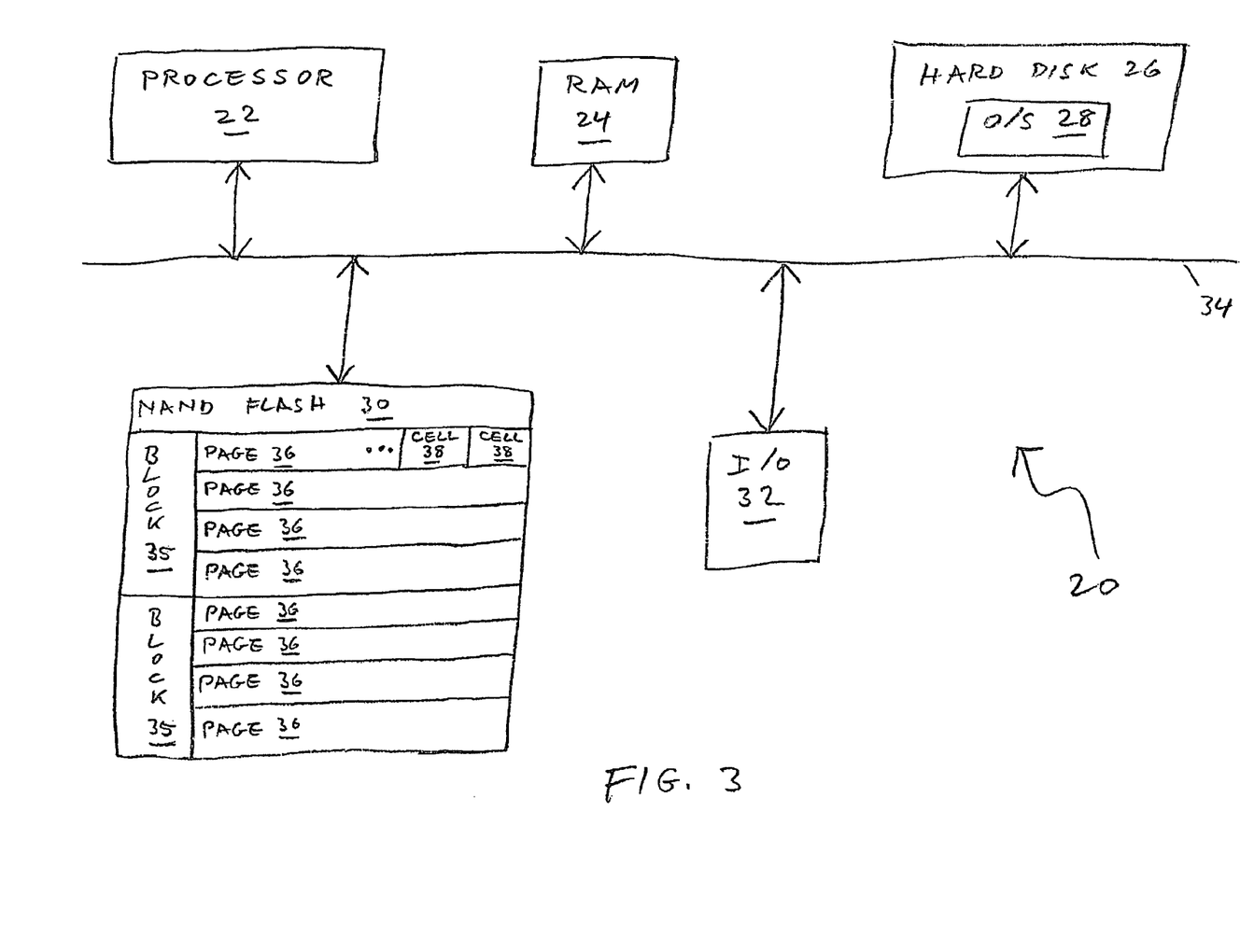
FIG. 3 is a high-level block diagram of a computer system of the present invention.

Device 10 is an example of a firmware implementation of the method of the present invention. FIG. 3 is a partial high level block diagram of a computer system 20 of the present invention that is an example of a software implementation of the method of the present invention. System 20 includes a processor 22; a RAM 24; input and output devices such as a keyboard and a display screen, represented collectively by I/O block 32; and two non-volatile mass storage memories: a hard disk 26 and an MBC NAND flash memory 30. Components 22, 24, 26,30 and 32 communicate with each other via a common bus 34. Among the data stored on hard disk 26 is the code of an operating system 28. When system 20 is powered up, processor 22 downloads the code of operating system 28 to RAM 24 and then executes the code of operating system 28 from RAM 24 to manage the operation of system 20. Hard disk 26 thus is an example of a computer-readable storage medium in which is embedded computer-readable code for implementing the method of the present invention.

Like memory 12, memory 30 includes a plurality of blocks 35, of which two are shown. Each block 35 includes four pages 36. Each page 36 includes a plurality of cells 38, of which two are shown in the first page 36.

The code of operating system 28 includes code for managing NAND flash memory 30 as taught in U.S. Pat. No. 5,494,485 and in U.S. Pat. No. 5,937,425. The code of operating system 28 also includes code for managing NAND flash memory 30 according to the principles of the present invention. When an application being executed by processor 22 requires storage of user data in NAND flash memory 30, processor 22 executes the appropriate code of operating system 28 to decide, for the blocks of NAND flash memory 30 in which the user data are to be stored, whether to store the user data in that block in SBC mode (N=1) or in MBC mode (N>1). In each such block of NAND flash memory 30, processor 22 reserves one or more flag cells to store the value of N selected for that block and programs that/those flag cell(s) accordingly, as described above.

While the invention has been described with respect to a limited number of embodiments, it will be appreciated that many variations, modifications and other applications of the invention may be made.

What is claimed is:

1. A method of managing a flash memory that includes at least one block, each block including a plurality of elements, each element having a respective threshold voltage, the method comprising:
for a first block of the at least one block:
selecting a first value of a parameter N of an N-bit programming mode associated with the first block;
designating a single cell of the first block to be a flag cell; and
setting the flag cell to represent the first value of the parameter N and programming at least one element of the first block other than the flag cell according to the N-bit programming mode,
wherein when the first value of the parameter N is greater than one, the flag cell is programmed according to the N-bit programming mode from an erased state such that only one bit of multiple bits stored at the flag cell is changed from an unprogrammed value to a programmed value to indicate multi-level operation of the first block.

2. The method of claim 1, wherein setting the flag cell includes programming the flag cell, and wherein the programming of the flag cell is effected using a public write command.

3. The method of claim 1, wherein setting the flag cell includes leaving the flag cell unprogrammed to represent the parameter N having the first value of one.

4. The method of claim 1, further comprising determining the first value of the parameter N by reading the flag cell according to a 1-bit programming mode.

5. The method of claim 1, wherein a particular element of the flash memory is programmed according to the N-bit programming mode by setting a threshold voltage of the particular element so that a reference voltage common to all values of the parameter N has a reference voltage value between the threshold voltage of the particular element and a threshold voltage of an unprogrammed element, and wherein the method further comprises determining the first value of the parameter N by comparing the threshold voltage of the flag cell to the reference voltage value.

6. The method of claim 5, wherein the reference voltage value is greater than the threshold voltage of the unprogrammed element.

7. The method of claim 1, further comprising:
selecting a second value of the parameter N; and
setting the flag cell to represent the second value of the parameter N.

8. The method of claim 7, wherein, for the first block, the second value of the parameter N is identical to the first value of the parameter N.

9. The method of claim 7, wherein the second value of the parameter N is different from the first value of the parameter N.

10. The method of claim 7, further comprising erasing the first block subsequent to setting the flag cell to represent the first value of the parameter N and prior to setting the flag cell to represent the second value of the parameter N.

11. The method of claim 1, wherein the first value of the parameter N is selected to be 2.

12. A memory device comprising:
a flash memory including a first block that includes a plurality of elements; and
a flash memory controller operative to:
select a value of a parameter N of an N-bit programming mode;
designate a single cell of the first block to be a flag cell; and
set the flag cell to represent the value of the parameter N and program at least one element of the first block other than the flag cell according to the N-bit programming mode,
wherein when the value of the parameter N is greater than one, the flag cell is programmed according to the N-bit programming mode from an erased state such that only one bit of multiple bits stored at the flag cell is changed from an unprogrammed value to a programmed value to indicate multi-level operation of the first block.

13. The memory device of claim 12, wherein the flash memory is a NAND flash memory.

14. The memory device of claim 12, wherein the flash memory controller is operative to select the value of the parameter N to be 2.

15. A system comprising:
a flash memory including a first block that includes a plurality of elements; and
a non-volatile memory to store program code associated with the first block, wherein the program code, when executed by a processor, causes the processor to:
select a value of a parameter N of an N-bit programming mode;

designate a single cell of the first block to be a flag cell; and set the flag cell to represent the selected value of the parameter N and program an element of the first block other than the flag cell according to the N-bit programming mode, wherein when the value of the parameter N is greater than one, the flag cell is programmed according to the N-bit programming mode from an erased state such that only one bit of multiple bits stored at the flag cell is changed from an unprogrammed value to a programmed value to indicate multi-level operation of the first block.

16. The system of claim 15, wherein the flash memory is a NAND flash memory.

17. The system of claim 15, wherein the value of the parameter N is selected to be 2.

18. A computer-readable storage medium storing computer-readable code to manage a flash memory that includes a first block, the first block including a plurality of elements, the computer-readable code comprising program code that, when executed by a processor, causes the processor to:

select a value of a parameter N of an N-bit programming mode;

designate a single cell of the first block as to be a flag cell; and set the flag cell to represent the value of the parameter N and program an element of the first block other than the flag cell according to the N-bit programming mode, wherein when the value of the parameter N is greater than one, the flag cell is programmed according to the N-bit programming mode from an erased state such that only one bit of multiple bits stored at the flag cell is changed from an unprogrammed value to a programmed value to indicate multi-level operation of the first block.

19. The computer-readable storage medium of claim 18, wherein the value of the parameter N is selected to be 2.

20. A method of managing a plurality of non-volatile storage elements, each storage element having a corresponding storage window divisible into a plurality of ranges of storage levels representative of N bits of data, wherein N is an integer greater than zero, the method comprising:

selecting a first value of N for storing data in one of the non-volatile storage elements;

designating a single cell of the non-volatile storage elements to be a flag storage cell; and setting the flag storage cell to represent the first value of N and programming at least one storage element of the non-volatile storage elements other than the flag storage cell according to an N-bit programming mode, wherein when the value of N is greater than one, the flag storage cell is programmed according to the N-bit programming mode from an erased state such that only one bit of multiple bits stored at the flag storage cell is changed from an unprogrammed value to a programmed value to indicate multi-level operation of the non-volatile storage element.

21. The method of claim 20, further comprising:
selecting a second value of N; and
setting the flag storage cell to represent the second value of N.

22. The method of claim 21, further comprising erasing the non-volatile storage elements subsequent to setting the flag storage cell to represent the first value of N and prior to setting the flag storage cell to represent the second value of N.

23. A memory device comprising:
a plurality of non-volatile storage elements, each storage element having a corresponding storage window divisible into a plurality of ranges of storage levels representative of N bits of data, wherein N is an integer greater than zero; and
a controller to:
select a value of N for storing data in one of the non-volatile storage elements,
wherein a single cell of the non-volatile storage elements is designated to be a flag storage cell; and
set the flag storage cell to represent the value of N and program a storage element, other than the flag storage cell according to an N-bit programming mode,
wherein when the value of N is greater than one, the flag storage cell is programmed according to the N-bit programming mode from an erased state such that only one bit of multiple bits stored at the flag storage cell is changed from an unprogrammed value to a programmed value to indicate multi-level operation of the non-volatile storage element.

24. The memory device of claim 23, wherein the storage elements are flash elements.

25. The memory device of claim 23, wherein the storage elements are NAND flash elements.

26. A system comprising:
a plurality of non-volatile storage elements, wherein each storage element has a corresponding storage window divisible into a plurality of ranges of storage levels representative of N bits of data, wherein N is an integer greater than zero; and
a non-volatile memory storing program code to:
select a value of N for storing data in one of the non-volatile storage elements;
designate a single cell of the non-volatile storage elements to be a flag storage cell; and
set the flag storage cell to represent the value of N and program at least one storage element of the non-volatile storage elements other than the flag storage cell according to an N-bit programming mode,
wherein when the value of N is greater than one, the flag storage cell is programmed according to the N-bit programming mode from an erased state such that only one bit of multiple bits stored at the flag storage cell is changed from an unprogrammed value to a programmed value to indicate multi-level operation of the non-volatile storage element.

27. The system of claim 26, wherein the storage elements are flash elements.

28. The system of claim 26, wherein the storage elements are NAND flash elements.

29. A computer-readable storage medium storing computer-readable code to manage a plurality of non-volatile storage elements, wherein each storage element has a corresponding storage window divisible into a plurality of ranges of storage levels representative of N bits of data, wherein N is an integer greater than zero, the computer-readable code comprising processor executable instructions that, when executed by a processor, cause the processor to:

select a value of N for storing data in one of the non-volatile storage elements;
designate a single cell of the non-volatile storage elements to be a flag storage cell; and
set the flag storage cell to represent the selected value of N and program at least one storage element of the non-volatile storage elements other than the flag storage cell according to an N-bit programming mode, wherein when the value of N is greater than one, the flag storage element is programmed according to the N-bit programming mode from an erased state such that only one bit of multiple bits stored at the flag storage element is changed from an unprogrammed value to a programmed value to indicate multi-level operation of the non-volatile storage element.

30. The method of claim 1, wherein the flag storage cell is set by programming the flag storage cell according to the N-bit programming mode.

31. A method of managing a flash memory that includes at least one block, each block including a plurality of elements, each element having a respective threshold voltage, the method comprising:
for a first block of the at least one block:
selecting a first value of a parameter N of an N-bit programming mode associated with the first block;
setting a single flag cell of the first block to represent the first value of the parameter N;
programming an element of the first block, other than the flag cell, according to the N-bit programming mode; and
reading the flag cell and the element of the first block other than the flag cell,
wherein when the value of the parameter N is greater than one, the flag cell is programmed according to the N-bit programming mode from an erased state such that only one bit of multiple bits stored at the flag cell is changed from an unprogrammed value to a programmed value to indicate multi-level operation of the first block.

32. A memory device comprising:
a flash memory including a first block that includes a plurality of elements; and
a flash memory controller operative to:
select a value of a parameter N of an N-bit programming mode;
designate a single cell of the first block to be a flag cell;
set the flag cell to represent the value of the parameter N;
program an element of the first block, other than the flag cell, according to the N-bit programming mode; and
read the flag cell and the element of the first block other than the flag cell,
wherein a single-bit value "0" read from the flag cell corresponds to N=1 and wherein a dual-bit value "01" and a dual-bit value "10" of the flag cell correspond to multi-level operation of the first block.

33. A system comprising:
a flash memory including a first block that includes a plurality of elements; and
a non-volatile memory to store program code associated with the first block, wherein the program code, when executed by a processor, causes the processor to:
select a value of a parameter N of an N-bit programming mode;
designate a single cell of the first block to be a flag cell;
set the flag cell to represent the selected value of the parameter N;
program an element of the first block, other than the flag cell, according to the N-bit programming mode; and
read the flag cell and the element of the first block other than the flag cell,
wherein a single-bit value "0" read from the flag cell corresponds to N=1 and wherein a dual-bit value "01" and a dual-bit value "10" of the flag cell correspond to multi-level operation of the first block.

34. A computer-readable storage medium storing computer-readable code to manage a flash memory that includes a first block, the first block including a plurality of elements, the computer-readable code comprising program code that, when executed by a processor, causes the processor to:
select a value of a parameter N of an N-bit programming mode;
designate a single cell of the first block to be a flag cell;
set the flag cell to represent the value of the parameter N;
program an element of the first block, other than the flag cell, according to the N-bit programming mode; and
read the flag cell and the element of the first block other than the flag cell,
wherein when the value of the parameter N is greater than one, the flag cell is programmed according to the N-bit programming mode from an erased state such that only one bit of multiple bits stored at the flag cell is changed from an unprogrammed value to a programmed value to indicate multi-level operation of the first block.

35. A method of managing a plurality of non-volatile storage elements, each storage element having a corresponding storage window divisible into a plurality of ranges of storage levels representative of $N \geq 1$ bits of data, the method comprising:
selecting a first value of N to store data in one of the non-volatile storage elements;
designating a single cell of the non-volatile storage elements to be a flag storage cell;
setting the flag storage cell to represent the first value of N;
programming a storage element of the non-volatile storage elements other than the flag storage cell according to an N-bit programming mode; and
reading the flag storage cell and the storage element other than the flag storage cell,
wherein when the value of N is greater than one, the flag storage cell is programmed according to the N-bit programming mode from an erased state such that only one bit of multiple bits stored at the flag storage cell is changed from an unprogrammed value to a programmed value to indicate multi-level operation of the non-volatile storage element.

36. A memory device comprising:
a plurality of non-volatile storage elements, each storage element having a corresponding storage window divisible into a plurality of ranges of storage levels representative of $N \geq 1$ bits of data; and
a controller to:
select a first value of N to store data in one of the non-volatile storage elements;
designate a single cell of the non-volatile storage elements to be a flag storage cell;
set the flag storage cell to represent the first value of N;
program a storage element of the non-volatile storage elements, other than the flag storage cell, according to an N-bit programming mode; and
read the flag storage cell and the storage element other than the flag storage cell,
wherein when the value of N is greater than one, the flag storage cell is programmed according to the N-bit programming mode from an erased state such that only one bit of multiple bits stored at the flag storage cell is changed from an unprogrammed value to a programmed value to indicate multi-level operation of the non-volatile storage element.

37. A system comprising:
a plurality of non-volatile storage elements, each storage element having a corresponding storage window divisible into a plurality of ranges of storage levels representative of $N \geq 1$ bits of data; and a non-volatile memory to store program code, wherein the program code, when executed by a processor, causes the processor to:

select a value of N to store data in one of the non-volatile storage elements, wherein a single cell of the non-volatile storage elements is designated to be a flag storage cell;

set the flag storage cell to represent the value of N;

program a storage element of the non-volatile storage elements, other than the flag storage cell according to an N-bit programming mode; and read the flag storage cell and the storage element of the non-volatile storage elements other than the flag storage cell, wherein when the value of N is greater than one, the flag storage cell is programmed according to the N-bit programming mode from an erased state such that only one bit of multiple bits stored at the flag storage cell is changed from an unprogrammed value to a programmed value to indicate multi-level operation of the non-volatile storage element.

38. A computer-readable storage medium storing computer-readable code to manage a plurality of non-volatile storage elements, wherein each storage element has a corresponding storage window divisible into a plurality of ranges of storage levels representative of $N \geq 1$ bits of data, the computer-readable code comprising processor executable instructions that, when executed by a processor, cause the processor to:

select a value of N to store data in one of the non-volatile storage elements;

designate a single cell of the non-volatile storage elements to be a flag storage cell;

set the flag storage cell to represent the value of N;

program a storage element of the non-volatile storage elements other than the flag storage cell according to an N-bit programming mode; and read the flag storage cell and the storage element of the non-volatile storage elements other than the flag storage cell, wherein when the value of N is greater than one, the flag storage cell is programmed according to the N-bit programming mode from an erased state such that only one bit of multiple bits stored at the flag storage cell is changed from an unprogrammed value to a programmed value to indicate multi-level operation of the non-volatile storage element.

* * * * *